May 23, 1972 J. L. LAUB 3,664,567

ARM ASSEMBLY FOR BONDING APPARATUS

Filed June 27, 1969 2 Sheets-Sheet 1

INVENTOR.
JOSEPH L. LAUB

BY

Christie, Parker & Hale
ATTORNEYS

United States Patent Office 3,664,567
Patented May 23, 1972

3,664,567

ARM ASSEMBLY FOR BONDING APPARATUS

Joseph L. Laub, Claremont, Calif., assignor to Unitek Corporation, Monrovia, Calif.

Filed June 27, 1969, Ser. No. 837,096
Int. Cl. B23k 21/00
U.S. Cl. 228—3 8 Claims

ABSTRACT OF THE DISCLOSURE

Apparatus for controlling the position and motion of a pivoted member. A pivoted bonding arm such as is provided in a bonding apparatus is biased into contact with a rotating cam during non-bonding intervals in the cycle of the bonding apparatus operation to limit the motion of the arm and overcome the inertial effects exerted on the arm due to the speed of apparatus operation.

DESCRIPTION OF THE PRIOR ART

This invention relates to control mechanisms and in particular to a mechanism for controlling the excursions of a pivoted arm about its pivot point.

Apparatus for making electrical circuit connections between the terminals of electronic devices and other points on the devices take several forms. In one type designated thermocompression bonders, high speed attachment of fine gold wire between leads and pads in semiconductor devices including transistors, integrated, monolithic and thin film circuits is accomplished by means of diffusion bonds of the wire to the connection points. Such bonds to interconnection points are accomplished by moving a capillary tip through which the gold wire is threaded to a specific location and supplying heat and pressure to the wire to produce a diffusion bond at that point. The capillary is then retracted by a bonding arm on which it is mounted to begin the search toward a second bonding location. When located in the vicinity of the second bonding site, precise adjustment is accomplished manually and the capillary lowered to the interconnection point to accomplish a bond as before. The arm then raises the capillary and returns it to a home position.

In one embodiment, raising and lowering of the bonding capillary is accomplished by pivotal motion of the bonding arm about its pivot point under the influence of a camming mechanism provided in the apparatus. In a conventional thermocompression bonder, the bonding arm is slightly unbalanced in the direction of the bonding capillary with the unbalance being overcome by force exerted by the cam on the arm except during bonding intervals when the cam rotates out of contact with the arm. The bonding arm tracks the rotating cam and is raised and lowered in accordance with the programmed outline of the cam. Since gravity is the force causing the arm to track the cam, it has been found that an upper limit to the rotational speed of the cam exists which limits the production rate of the apparatus. Attempts to increase this speed without other modifications leave an insufficient amount of time for the bond to be made before the cam begins to again exert force on the bonding arm.

SUMMARY OF THE INVENTION

The present invention provides an improved bonding apparatus enabling substantial increase in the speed of operation of the apparatus and the consequent increase of the production rate available by the use of such an apparatus. Thus, the invention provides in an apparatus for bonding a member to a work location an improvement comprising an arm pivotally mounted in the apparatus, the arm having a bonding tool mounted at one end thereof. Means are provided for periodically contacting the bonding arm at a point removed from the pivot point for causing the bnding arm and tip to be retracted relative to a workpiece to be bonded at a work location during the interval of contacting. Biasing means are also provided for applying a predetermined amount of bonding force to the bonding arm during the interval of contact between the bonding arm and contacting means to cause the bonding arm to positively engage and follow the contacting means and increasing the speed of operation of the apparatus.

The foregoing is accomplished by providing a biasing mechanism, e.g., an extension or leaf spring suitably mounted relative to the bonding arm to "preload" the bonding arm between the short predetermined intervals on the operating cam corresponding to the bonding intervals. By maintaining such contact and thereby achieving positive positioning of the bonding arm against the cam, the angular rotation of the cam can be significantly increased without the cam losing contact with a bearing surface on the bonding arm.

The design of the cam and transition points provided thereon is such that impact on the bonding arm is essentially eliminated. The cam design further provides that, except in the intervals immediately prior to bonding tip contact with the workpiece, the bonding arm can be subjected to acceleration due to high speed rotation of the cam without affecting the quality of bonds achieved by the apparatus. In the interval immediately prior to tip-workpiece contact, the cam outline changes such that the tip approaches the workpiece at a uniform predetermined velocity. This speed of approach is selected such that no excessive forces are produced when tip-workpiece contact is established.

In a typical operating sequence of a thermocompression bonder, the apparatus performs a preset search above each bond site, finite manual locational adjustment, a bond at each site, and an automatic flame cutoff of the wire after the second bond. Each search and bond is actuated with a positive hand actuator, the operation of which is coordinated with and complemented by, in a preferred embodiment, a workstage micromanipulator. Process control is accomplished by programming the apparatus to provide consistent and uniform flame cutoff, search levels, bonding force, duration and heat during each cycle of operation. Normally the process control for each package style used with such an apparatus is accomplished by an adjustment of one or more cams to provide the exact bonding operations required. Bonding force can be altered by changing adjustable weights located in the interior of the apparatus.

DESCRIPTION OF THE DRAWINGS

These and other advantages of the present invention will be better understood by reference to the following figures in which:

FIG. 3 is a plan view of the apparatus taken along line 3—3 of FIG. 2; and

DESCRIPTION OF A SPECIFIC EMBODIMENT

Figure 1:
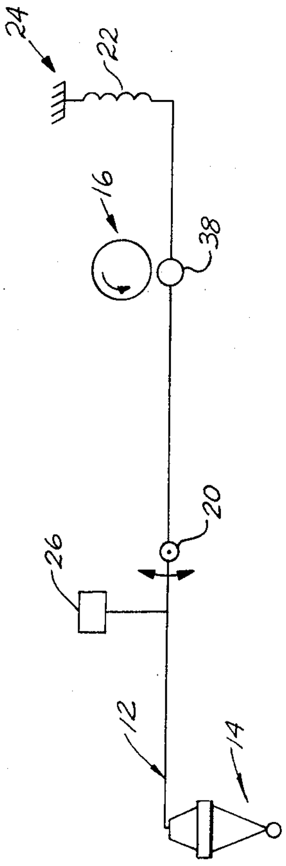
FIG. 1 is a diagrammatic representation of the bonding arm portion of the thermocompression bonder.
Figure 2:
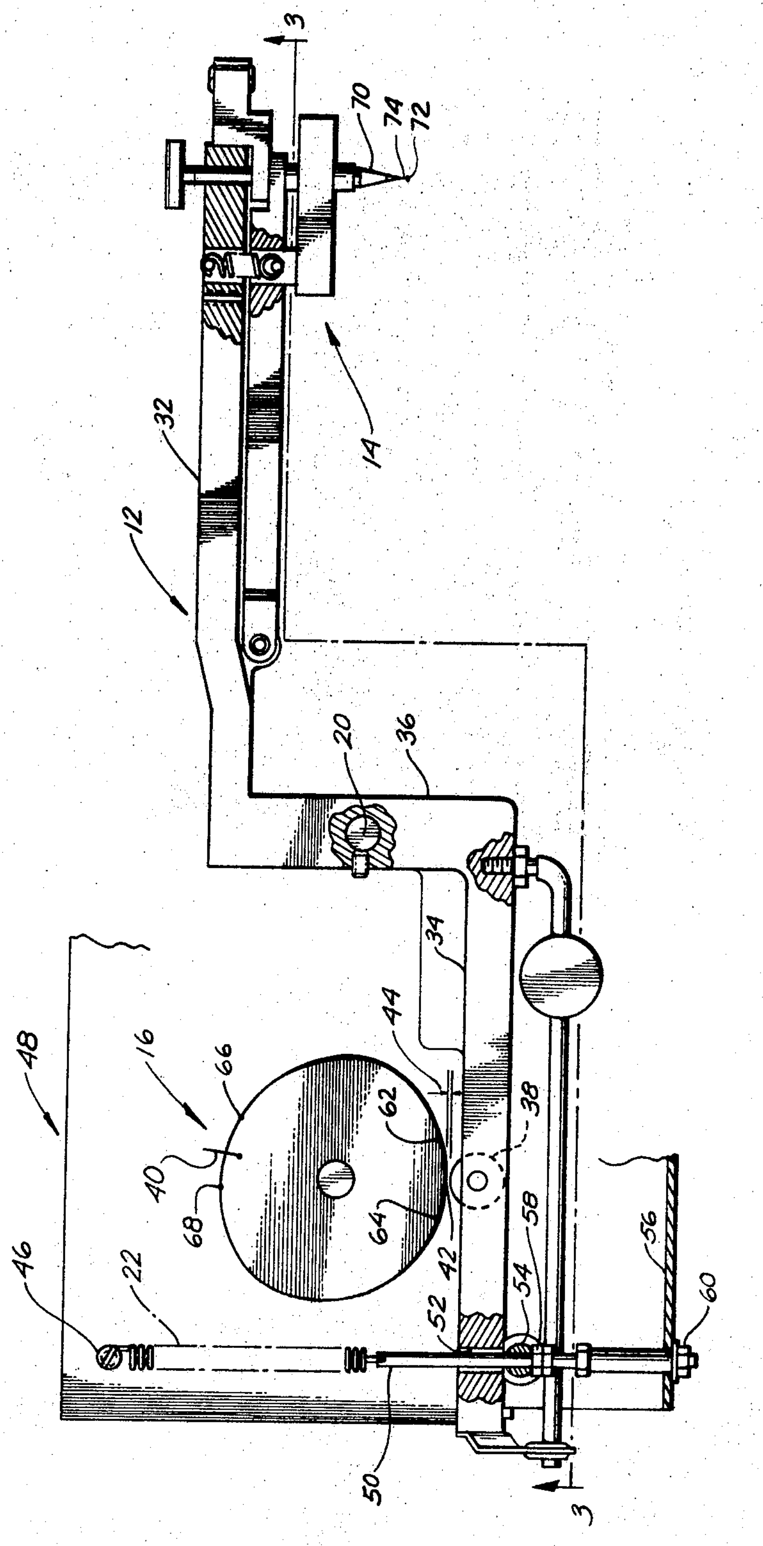

The diagram of FIG. 1 depicts a bonding arm 12 in a thermocompression bonding apparatus having a capillary tip assembly 14 attached at one end of the arm and operatively engaging a cam 16 on the side of a pivot point 20 for arm 12 opposite assembly 14. Under the influence of the cam, the bonding tip assembly is raised and lowered relative to a work location. These raised and lowered positions correspond to the portions of a cycle of operation of the bonding apparatus during which the bonding head is in a search position and in a bonding position respectively.

An extension spring 22 is connected between the end of bonding arm 12 opposite assembly 14 and a solid support 24. The function of spring 22 is to apply a force to the bonder arm 12 and thereby positively maintain a point of contact of the arm with cam 16 during the non-bonding intervals of the bonding apparatus operations. Bonding arm 12 is weighted or a weight 26 is mounted on the arm to unbalance it toward the end on which the bonding tip is mounted. The purpose of weighting is to provide a predetermined amount of bonding force through the tip to the gold wire and interconnection point during the production of a thermocompression bond at a work location. The location of weight 26 along arm 12 can be changed to alter the amount of unbalance and, therefore, the amount of bonding force provided.

Figure 2:
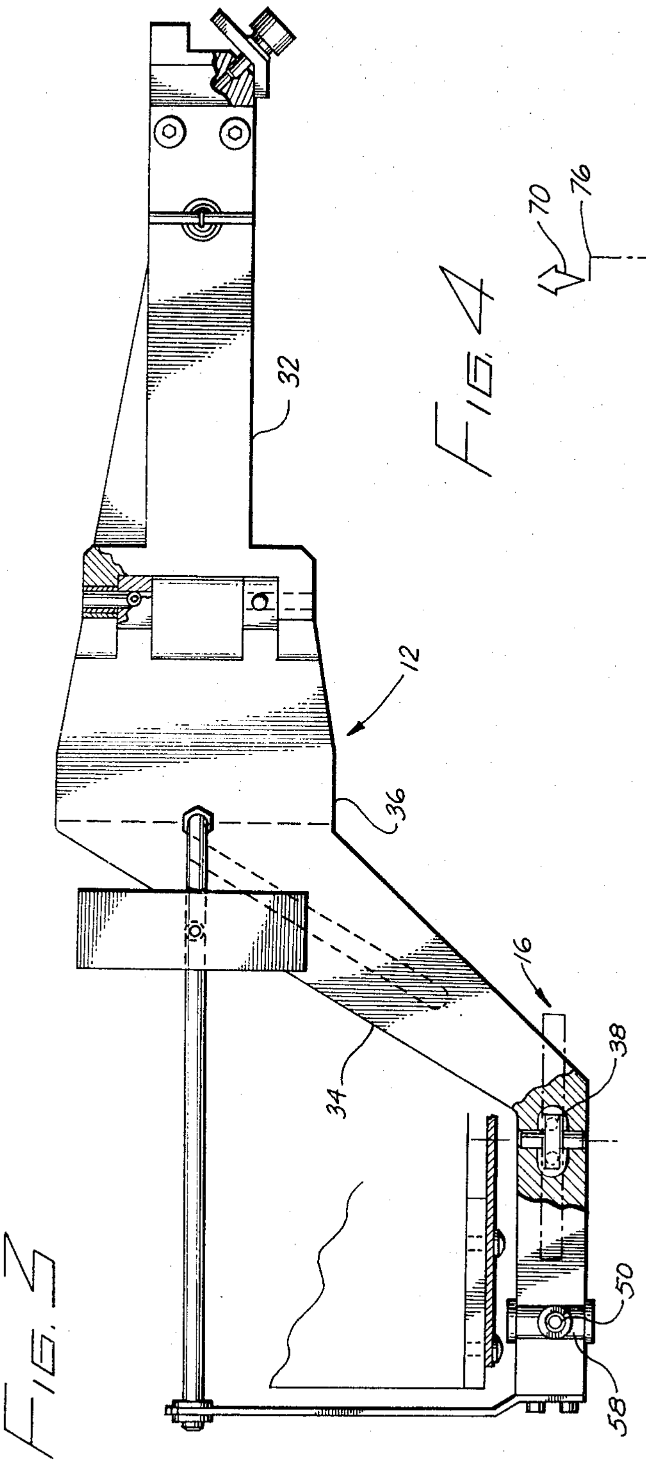
FIG. 2 is an elevational view of a specific embodiment of a bonding arm and cam according to the present invention.

A specific embodiment of the bonding arm is shown in FIGS. 2 and 3. Insofar as the elements shown in FIG. 1 are shown again in FIGS. 2 and 3, common reference numerals will be used to identify the elements of the apparatus. As shown in these figures, bonding arm 12 is comprised of three sections. End section 32 supports bonding assembly 14, end section 34 is connected to extension spring 22 and the third and middle section 36 defines the location of pivot point 20. Cam 16 is located above section 34 in operative relationship with a ball bearing 38 which is rotatably mounted in section 34. Cam 16 is an approximately circular structure with two areas of eccentricity defined by the area lying between transition points 64, 62 and 66, 68. These areas correspond to two bonding intervals during a typical bonding cycle of the apparatus with which the arm is associated. Points 40, 42 on the cam correspond to the precise location on cam 16 corresponding to the first and second bond positions respectively. At these bonding positions on the motion cam 16, a gap 44 exists between the bearing 38 and the surface of cam 16, a typical dimension for such a gap being .002 inch.

The loading of arm 12 during the non-bonding intervals is accomplished by means of extension spring 22 which is anchored at 46 to mechanism housing 48 and which is connected by means of a threaded adjustment rod 50 to a bracket 56. Rod 50 is connected at the end of the spring opposite its anchoring point and extends through an aperture 52 in section 34 of the bonding arm and through a cam loading bearing 54 to bracket 56. During the non-bonding intervals when a preload is applied to the bonding arm, as cam 16 rotates in contact with bearing 38, the end of section 34 adjacent loading bearing 54 rests on this loading bearing. Extension spring 22 then applies a force to the bonder arm and causes bearing 38 to contact and follow cam 16. This "preload" force on arm 12 is exerted throughout the rotation of the cam except for small predetermined areas bracketing the bond locations 40 and 42 on cam 16. This positive spring loaded contact between arm and cam allows angular rotation of the cam to be increased in one embodiment of the apparatus from approximately 50 r.p.m. to 100 r.p.m. without the cam and ball bearing losing contact. The position of bearing 54 is adjustable and is controlled by adjustment nut 58. A second adjustment nut 60 located below bracket 56 and threaded onto rod 50 provides a second point of adjustment for the assembly.

By proper design of cam 16 and the placement of certain transition points on the cam preceding the bond locations, the acceleration imparted to arm and tip between bonds is stopped and a uniform velocity is imparted which causes the tip to approach and contact the workpiece at a specific predetermined rate. Points 64 and 66 and points 62 and 68 on cam 16 designate the points at which force exerted by spring 22 on arm 12 is released and is thereafter restored, respectively, for the corresponding direction of rotation. In the embodiment shown in FIGS. 2 and 3, points 64 and 66 immediately precede the change from an accelerated to uniform rate of motion of the arm and tip. The various transitions just described are made such that impact on the bonder arm is essentially eliminated.

In an actual bonding operation, arm 12 pivots about point 20 lowering a bonding tip 70 such that a ball 72 formed at the end of a gold wire 74 extending through tip 70 is brought to bear on a work location. By the exertion of force by tip 70 and the application of heat through assembly 14 the gold ball 72 is bonded to the work location by means of a thermocompression bond.

A gap between cam 16 and bearing 38 at bonding on the order of a few thousandths of an inch has been found to be satisfactory. This gap is set by means of adjusting nuts 58 whose longitudinal position along rod 50 is varied to increase or decrease the gap at the bonding interval and to compensate for the variation in heights of the workpieces to be bonded. Adjusting nut 60 is longitudinally advanced and retracted along rod 50 to set the desired amount of preloading in the extension spring 22. A satisfactory amount of loading on the bonder arm during the non-bonding intervals has been found to be on the order of 30 grams. Typical amounts of force exerted on the bonding arm during the interval of bonding is typically 30 to 60 grams.

Because of the relatively small amount of unbalance in the bonding arm, inertial forces limit the speed at which the arm will "track" the cam and thereby limit the maximum production rate attainable with the apparatus. By means of the present invention, however, the speed of rotation of the bonding cam is significantly increased, thereby increasing the number of bonds producible per unit time. As indicated above, in one embodiment, production is approximately doubled corresponding to the doubling of the speed of rotation of the controlling cams.

Figure 4:
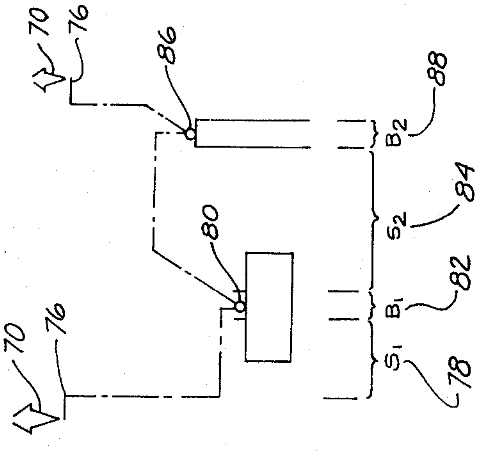
FIG. 4 is a schematic diagram of a two-bond sequence during a typical cycle of operation of such a bonder.

A typical cycle of operation of a bonding apparatus is illustrated in FIG. 4 and will be described in conjunction with that figure and FIGS. 1 and 2. As shown in FIG. 4, a bonding tip 70 moves from a home position 76 through a first search ($S_1$) 78 until the bonding tip is positioned over a work location 80. During this interval ($S_1$) cam 16 is in contact with bonding arm 12 and rotates out of contact with the bonding arm as spring biasing is removed and transition point 66 moves past ball bearing 38. Tip 70 completes its descent to and comes in contact with work location 80. The interval ($B_1$) of the first bond of the cycle of operation in FIG. 4 is indicated at 82. Cam 16 stops with bond location 40 positioned opposite bearing 38 during this interval as the bond is made. When this bond is completed, cam 16 again rotates into contact with arm 12 and spring 22 is again extended biasing the arm to its "preload" position. The apparatus embarks on a second search ($S_2$) 84 moving from the location of the first bond to a point positioned over a second work location 86. The position of the cam at this instant is one in which transition point 64 is moving past bearing 38. Following this, point 42 corresponding to a second bond location on cam 16 completes its vertical excursion and stops opposite bearing 38. At the completion of bonding, transition point 64 on cam 16 comes into contact with the bonding arm biasing it to the "preload" position again and the tip returns to its home position 76 preparatory to the start of a succeeding cycle.

In another embodiment of the apparatus according to the present invention, an additional cam is provided for controlling the motion of the bonder arm during the bonding portion of apparatus operation. In this embodiment the preloading cam and the added bonding cam have corresponding outlines such that the transition of control of the arm from one cam to the other is smooth and essentially impact free. An alternative embodiment to the extension spring 22 shown in FIGS. 2 and 3 is a leaf spring mounted on the apparatus housing and extending to a point of connection on the bonder arm between the loading cam and the end of the arm opposite the bonding tip.

The present invention has been described in conjunction with its utilization in a thermocompression bonding apparatus. In addition, the invention is also contemplated to be applicable to other types of bonding apparatus including ultrasonic bonders as well as other apparatus in which a lightweight or lightly unbalanced pivoted arm is required to move rapidly and positively about its pivot point without significant impact or vibration.

What is claimed is:

1. In a bonding apparatus having a housing the improvement comprising:

a pivotally mounted bonding arm having a bonding tip attached at one end thereof;

means for applying a predetermined amount of force to the tip during the bonding intervals of apparatus operation;

rotatable cam means having a profile with first and second profile portions such that the first profile portion of the cam means contacts the bonding arm at a point thereon removed from the pivot point and the tip end of the bonding arm during a nonbonding interval of apparatus operation for causing the bonding arm to be positively retracted relative to a bonding location and the second profile portion of the cam means is out of contact with the bonding arm during a bonding interval of apparatus operation; and biasing means for applying a predetermined amount of loading force to the bonding arm during said nonbonding interval to cause the bonding arm to positively engage and follow the cam means, said biasing means extending between a support point on the hous- and the bonding arm.

2. The apparatus according to claim 1 including rotatable bearing means incorporated in the bonding arm for engaging the rotatable cam.

3. The apparatus according to claim 2 wherein the biasing means is an extension spring.

4. The apparatus according to claim 2 wherein the biasing means is a leaf spring.

5. The apparatus according to claim 2 wherein the cam is arranged to be spaced from the bearing means by a predetermined distance during the interval of contact between the tip and the work location.

6. The apparatus according to claim 5 including adjustment means operatively engaged with the biasing means and bonding arm for varying the predetermined spacing distance between the cam and the bearing means.

7. The apparatus according to claim 6 including adjustment means operatively engaged with the biasing means for varying the amount of biasing force exerted on the arm.

8. The apparatus according to claim 7 including support means for engaging the bonding arm during the intervals of contact between the cam and the rotatable bearing means.

References Cited

UNITED STATES PATENTS

| | | | |
|---|---|---|---|
| 2,956,437 | 10/1960 | Opocensky | 74—54 |
| 2,939,337 | 6/1960 | Sweger | 74—54 X |
| 3,451,607 | 6/1969 | Miller et al. | 228—1 |
| 3,342,395 | 9/1967 | Diedeveen | 228—1 |
| 3,341,682 | 9/1967 | Fegley | 228—4 X |
| 3,313,464 | 4/1967 | Avedissian | 228—5 X |
| 3,168,885 | 2/1965 | Weiss | 228—47 X |
| 3,128,648 | 4/1964 | Clagett | 228—4 |
| 3,083,595 | 4/1963 | Frank et al. | 78—82 |

JOHN F. CAMPBELL, Primary Examiner

R. J. CRAIG, Assistant Examiner

U.S. Cl. X.R.

29—470.1; 74—54